United States Patent
Uemura et al.

(10) Patent No.: US 8,643,047 B2
(45) Date of Patent: Feb. 4, 2014

(54) LIGHT-EMITTING DEVICE AND LUMINAIRE

(75) Inventors: Kozo Uemura, Yokosuka (JP); Soichi Shibusawa, Yokosuka (JP); Yumiko Hayashida, Yokosuka (JP); Kiyoshi Nishimura, Yokosuka (JP); Seiko Kawashima, Yokosuka (JP); Tsuyoshi Oyaizu, Yokosuka (JP); Masahiro Ogata, Yokosuka (JP); Shuhei Matsuda, Yokosuka (JP); Hiroki Tamai, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 40 days.

(21) Appl. No.: 13/414,458

(22) Filed: Mar. 7, 2012

(65) Prior Publication Data

US 2012/0305963 A1    Dec. 6, 2012

(30) Foreign Application Priority Data

Jun. 3, 2011  (JP) .................................. 2011-125234
Jul. 29, 2011  (JP) .................................. 2011-167518

(51) Int. Cl.
*H01L 33/00* (2010.01)

(52) U.S. Cl.
USPC .................................... 257/98; 257/E33.072

(58) Field of Classification Search
USPC ............. 257/98, E33.072, E33.001, E33.055, 257/E33.067, E33.071, 91, 99, 100, 79, 81, 257/88; 438/22, 26–29, 34
See application file for complete search history.

(56) References Cited

U.S. PATENT DOCUMENTS

2011/0291143 A1*  12/2011  Kim et al. .......................... 257/98
2013/0137795 A1*  5/2013  Hara et al. ...................... 523/400

FOREIGN PATENT DOCUMENTS

| DE | 102008025381 A1 | * | 12/2009 | ............. H01L 33/00 |
| JP | 05-299702 | | 11/1993 | |
| WO | WO 2010/077082 | * | 7/2010 | ............. H01L 33/52 |
| WO | WO 2012/020730 | * | 2/2012 | ............. C08G 77/14 |

OTHER PUBLICATIONS

English translation, Tokairin, JP H05-299702, published in Japanese Nov. 12, 1993 (translated by FLS, Inc. Jun. 2013), all pages.*
Translation, Tokairin, JP H05-299702, Translation Date Jun. 2013, FLS, Inc., all pages.*
English translation, Abstract, Tonhofer, German Patent Pub. DE 102008025318A1, Thomson Reuters, 2013, all pages.*

* cited by examiner

*Primary Examiner* — Fernando L Toledo
*Assistant Examiner* — Victoria K Hall
(74) *Attorney, Agent, or Firm* — Patterson & Sheridan, LLP

(57) ABSTRACT

A light-emitting device includes a substrate, a reflecting layer formed on the substrate, a light-emitting element placed on the reflecting layer, and a sealing resin layer that covers the reflecting layer and the light-emitting element. The oxygen permeability of the sealing resin layer is equal to or lower than 1200 cm$^3$/(m$^2$·day·atm), and the ratio of the area of the reflecting layer covered by the sealing resin layer to the entire area on the resin substrate covered by the sealing resin layer is between 30% and 75% inclusive.

12 Claims, 10 Drawing Sheets

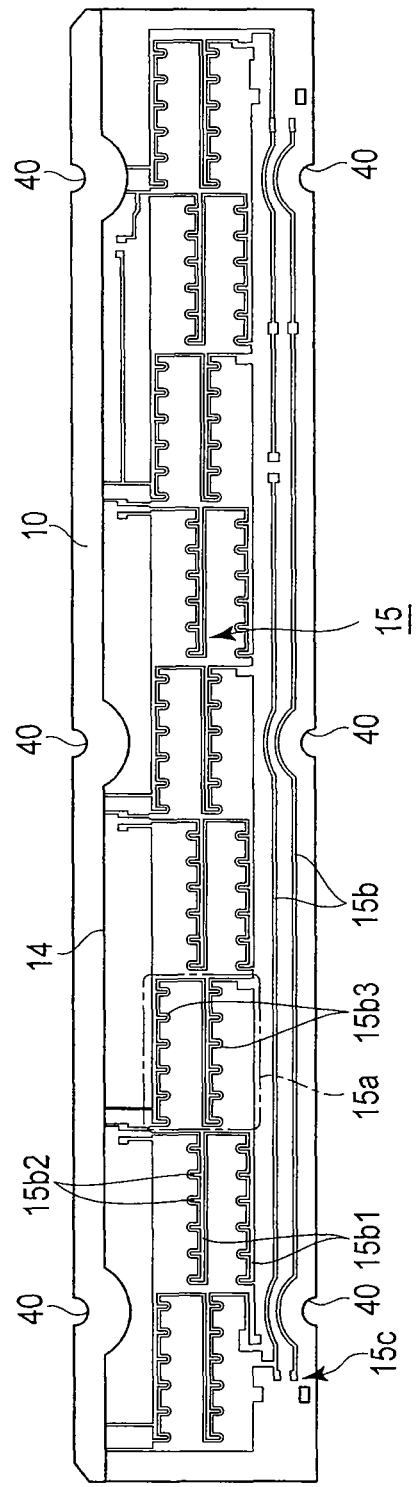
F I G. 2

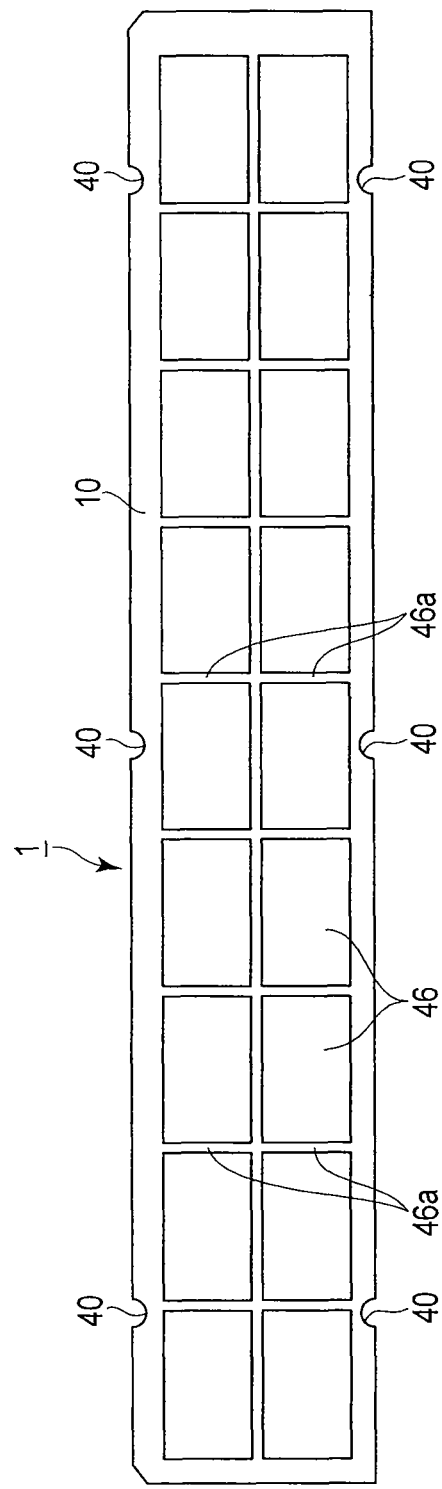
F I G. 5

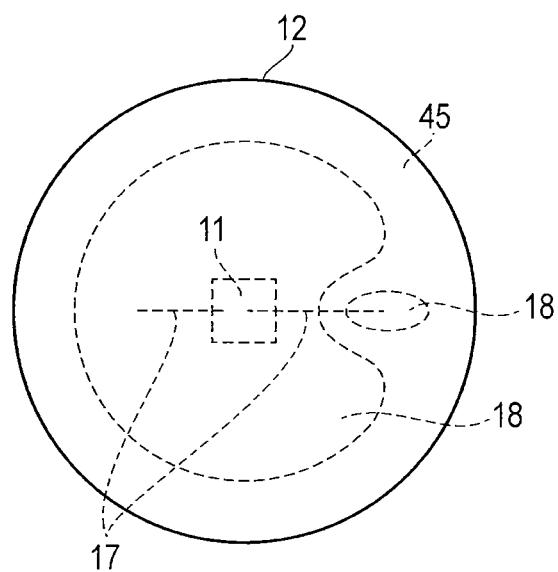
F I G. 7

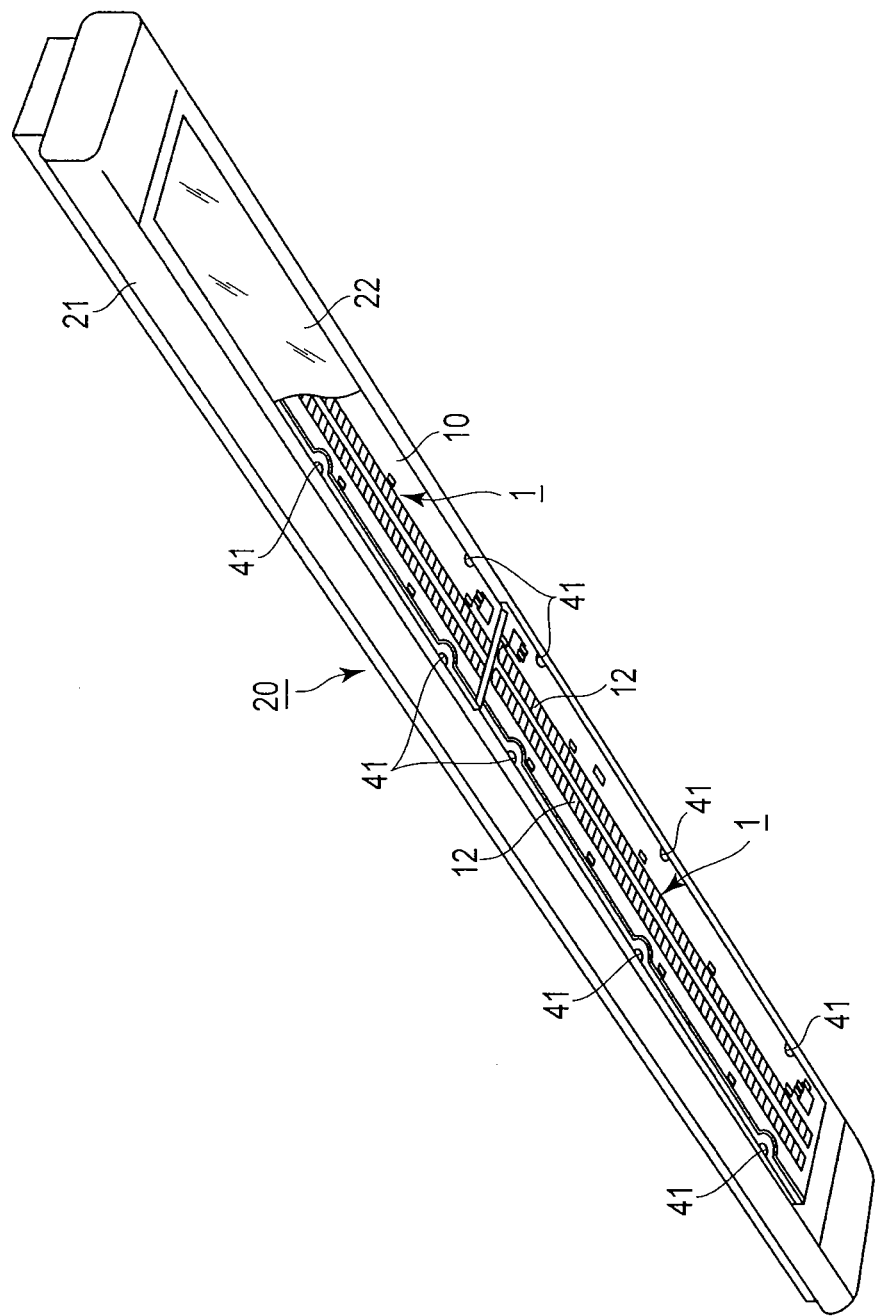
F I G. 8

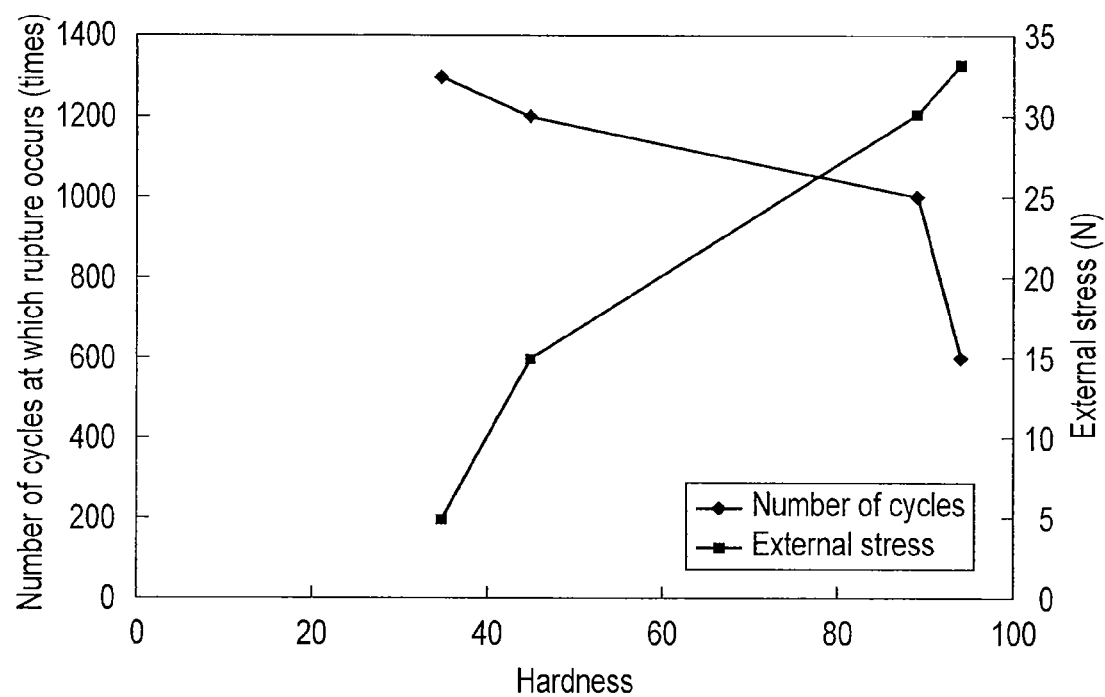
F I G. 11

LIGHT-EMITTING DEVICE AND LUMINAIRE

CROSS-REFERENCE TO RELATED APPLICATIONS

This application is based upon and claims the benefit of priority from prior Japanese Patent Applications No. 2011-125234, filed Jun. 3, 2011; and No. 2011-167518, filed Jul. 29, 2011; the entire contents of which are incorporated herein by reference.

FIELD

Embodiments described herein relate generally to a light-emitting device including light-emitting elements and a luminaire.

BACKGROUND

A luminaire including a light-emitting device in which plural light-emitting elements such as light-emitting diodes (LEDs) are disposed on a substrate as a light source is widely known. As the luminaire of this type, for example, a base light of a so-called ceiling mounting type directly attached to the ceiling is known.

The light-emitting device is configured by, for example, directly mounting the plural light-emitting elements on the surface of a resin substrate formed of a resin material. In such a light-emitting device, the respective light-emitting elements are covered and sealed by sealing resin layers including phosphors and thermosetting resin.

However, in the light-emitting device of such a type, it is known that an organic gas emitted from the resin substrate and the gas in the atmosphere permeate through sealing resin layers. Therefore, it is likely that the performance of the light-emitting device deteriorates and the life of the light-emitting device is reduced.

Specifically, when the organic gas or the gas such as oxygen and water vapor in the atmosphere permeates through the sealing resin layers and reaches a reflecting layer, it causes the discoloration of the reflecting layer, the deterioration of the reflection performance, and the reduction in the luminous flux maintenance factor. Further, it is likely that bonding wires connecting the light-emitting elements and electrodes are corroded by the gas permeated through the sealing resin layers, the possibility of rupture of the wires is increased, and the life of the light-emitting device is reduced.

Therefore, there is a demand for development of a light-emitting device that can extend the life and improve the performance and a luminaire including such a light-emitting device.

BRIEF DESCRIPTION OF THE DRAWINGS

FIG. 2 is a plan view of a wiring pattern and a connection pattern of a resin substrate of the light-emitting device shown in FIG. 1;

FIG. 5 is a rear view of the resin substrate shown in FIG. 2 from which an insulating layer is removed;

FIG. 7 is a schematic diagram of one of the sealing resin layers of the light-emitting device shown in FIG. 1 viewed from above;

FIG. 8 is a perspective view of a luminaire including the light-emitting device shown in FIG. 1;

FIG. 11 is a graph of a relation among the hardness and external stress resistance of the thermosetting resin and the number of cycles at which rupture occurs.

DETAILED DESCRIPTION

Figure 1:
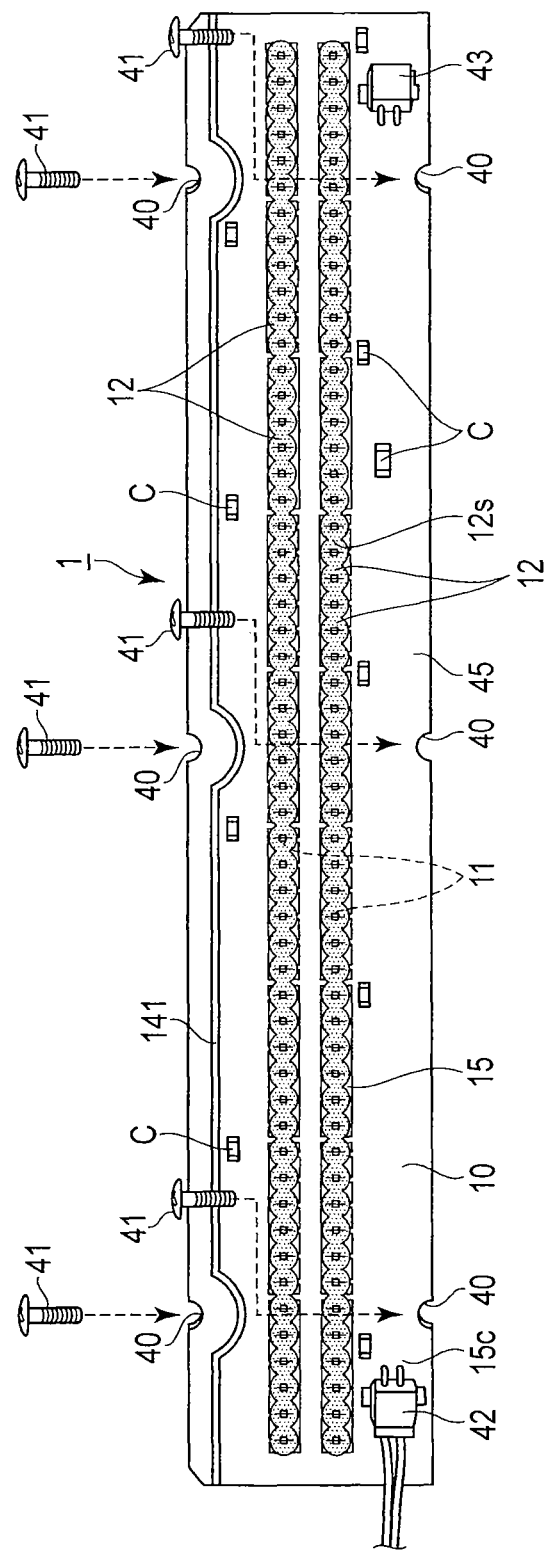
FIG. 1 is a plan view of a light-emitting device according to an embodiment viewed from the front side.

According to one embodiment, a light-emitting device includes a resin substrate, a reflecting layer formed on the resin substrate, a protection layer formed around the reflecting layer, a light-emitting element placed on the reflecting layer, and a sealing resin layer that covers the reflecting layer, the protection layer, and the light-emitting element. The oxygen permeability of the sealing resin layer is equal to or lower than $1200\,cm^3/(m^2 \cdot day \cdot atm)$. A ratio of the area of the reflecting layer to the area of a sealing region on the resin substrate covered by the sealing resin layer is within a range of a ratio equal to or higher than 30% and equal to or lower than 75%.

Various embodiments will be described hereinafter with reference to the accompanying drawings. FIGS. 1 to 7 are diagrams of a light-emitting device 1 according to an embodiment. FIG. 8 is a diagram of a luminaire 20 including the light-emitting device 1. The same components in the figures are denoted by the same reference numerals and signs and redundant explanation of the components is omitted.

Figure 6:
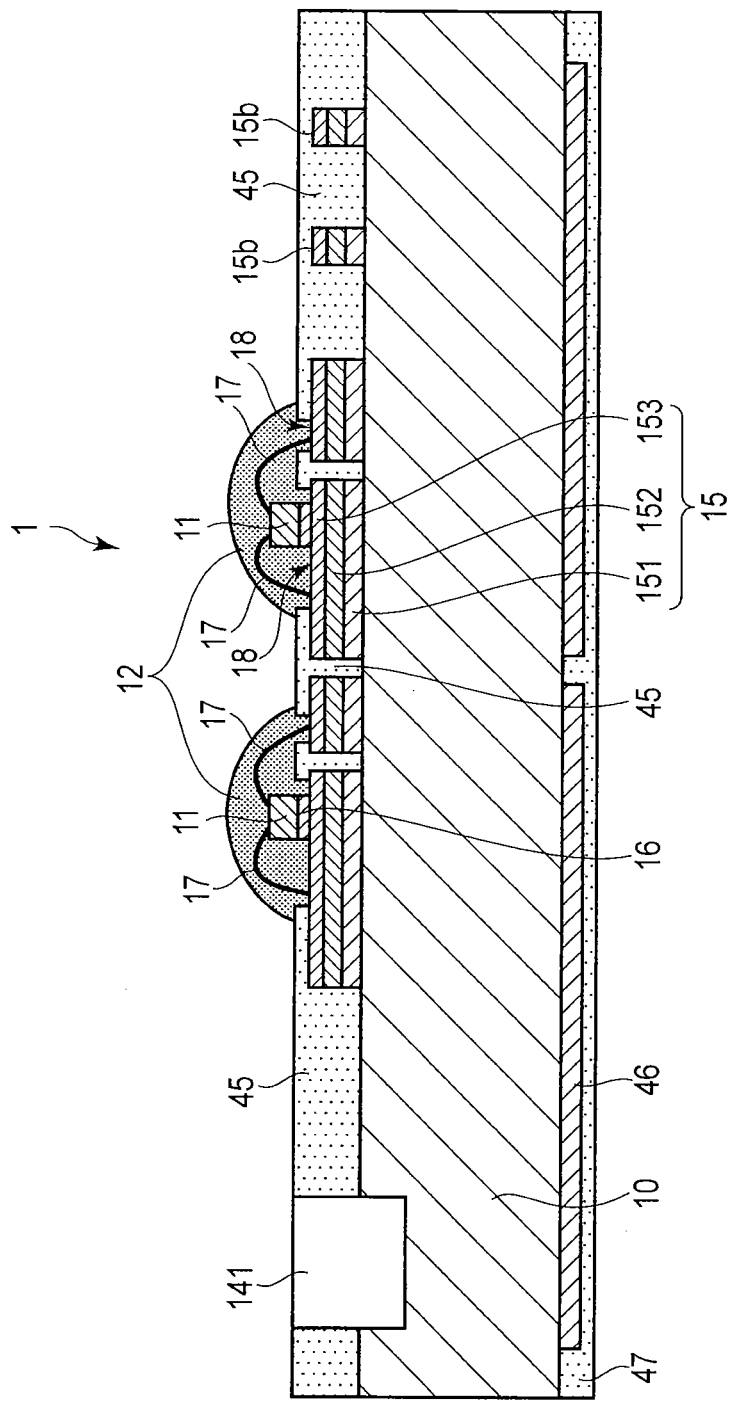
FIG. 6 is a schematic sectional view taken along line F6-F6 shown in FIG. 4.

As shown in FIG. 1, the light-emitting device 1 includes a resin substrate 10, plural light-emitting elements 11, and sealing resin layers 12 that cover the light-emitting elements 11. As shown in FIG. 6, reflecting layers 18 are formed on the front surface of the resin substrate 10. A resist layer 45, which is a protection layer, is formed around the reflecting layers 18. The light-emitting elements 11 are placed on the reflecting layers 18. The sealing resin layers 12 are formed on the reflecting layers 18 and a part of the resist layer 45 around the reflecting layers 18.

The resin substrate 10 may be formed of glass epoxy resin or other synthetic resin materials. For example, a glass epoxy printed board (FR-4, CEM-3, etc.) can be used.

The resin substrate 10 is formed in an elongated rectangular shape. For example, the length of the resin substrate 10 can be set to 230 mm and the width of the resin substrate 10 can be set to 35 mm. The thickness of the resin substrate 10 is desirably equal to or larger than 0.5 mm and equal to or smaller than 1.8 mm and can be set to, for example, 1 mm. The shape of the resin substrate 10 is not limited to the rectangular shape and may be a square shape or a circular shape.

Alternatively, in order to improve thermal radiation properties of the light-emitting elements 11, a resin substrate including a base plate of metal can also be used. Specifically, as shown in FIGS. 5 and 6, the resin substrate 10 is formed by sticking a copper foil 46 or the like to the surface of the glass epoxy resin and providing an insulating layer 47 on the copper foil 46 except a portion of the copper foil 46. This is a structure equivalent to a printed board generally used in an electric product.

In the light-emitting device 1 according to this embodiment, the plural light-emitting elements 11 are mounted side by side on the surface of the resin substrate to form rows and individually covered by the sealing resin layers 12. Ends of the sealing resin layers 12 are formed as spherical surfaces having a substantially fixed radius centered on the light-emitting elements 11 at the ends of the rows.

Further, the resist layer 45, which is the protection layer, is formed on the front surface of the resin substrate 10 to cover the periphery of the reflecting layers 18. The resist layer 45 is provided over substantially the entire front surface of the resin substrate 10. A white resist having high reflectance is suitably used for the resist layer 45. For convenience of explanation, in FIGS. 2 to 4, a wiring pattern 15 and the like are shown. However, when the white resist layer 45 is actually formed, the wiring pattern 15 and the like are less easily seen visually.

The long side of the resin substrate 10 includes plural perforated sections 40 prepared for fixing the resin substrate 10. The perforated sections 40 are arcuate cutout sections connected to the outer periphery of the resin substrate 10. The perforated sections 40 are used when the light-emitting device 1 is fixed to a luminaire main body 21 of the luminaire 20 shown in FIG. 8. In this embodiment, shaft sections of attachment screws 41 functioning as fixing means are screwed into the luminaire main body 21 of the luminaire 20 piercing through the cutout sections. The heads of the attachment screws 41 are caught by the cutout sections and fixed. Consequently, the light-emitting device 1 is fixed to the luminaire main body 21.

Figure 3:
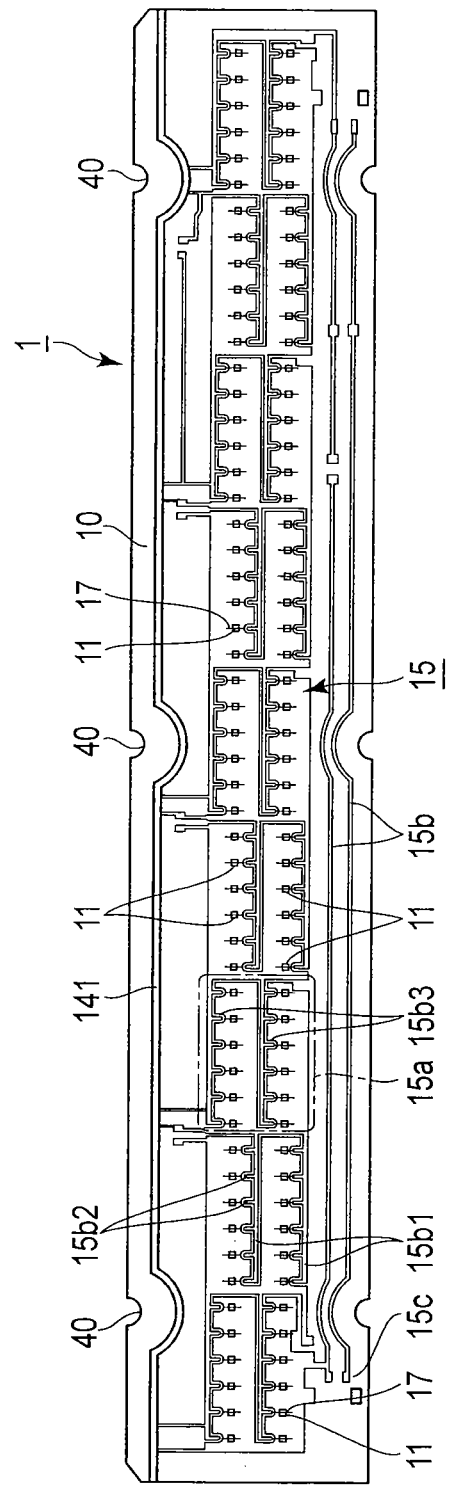
FIG. 3 is a plan view of a state in which the connection pattern is removed from the resin substrate shown in FIG. 2 and light-emitting elements are mounted.

As shown in FIG. 3, the resin substrate 10 includes a groove 141 on the front surface side of the resin substrate 10. As shown in FIG. 1, a power-supply connector 42, a connection connector 43, and a capacitor C are mounted on the front surface of the resin substrate 10.

The groove 141 is a mark formed for removing a connection pattern 14 explained later. The power-supply connector 42 is connected to a power-supply. The connection connector 43 is used when the plural light-emitting elements 11 are coupled to one another. The capacitor C is provided to prevent the light-emitting elements 11 from being turned on by mistake because noise is accumulated in a lighting circuit.

As shown in FIGS. 2 to 4 and FIG. 6, the resin substrate 10 includes, on the front surface side of the resin substrate 10, the wiring pattern 15 embedded in the resist layer 45. The wiring pattern 15 includes mounting pads 15a, power-supply conductors 15b, and power-supply terminals 15c.

As shown in FIG. 2, one mounting pad 15a is basically formed in a substantially rectangular shape extending along the longitudinal direction of the resin substrate 10. The mounting pad 15a includes two slender power-supply conductors 15b1 extending in the longitudinal direction of the resin substrate 10 from the short sides. The power-supply conductor 15b1 includes plural, in this embodiment, six power feeders 15b2 projecting in a direction orthogonal to the extending direction of the power-supply conductors 15b1.

The power-supply conductors 15b electrically connect the mounting pads 15a. The power-supply terminals 15c are prepared at ends of the power-supply conductors 15b. The power-supply connector 42 is connected to the power-supply terminals 15c.

As shown in FIG. 2, the mounting pad 15a connects with the power-supply conductors 15b1 of an adjacent mounting pad in the longitudinal direction of the resin substrate 10 along one of the long sides and the center of the adjacent mounting pad while leaving insulation space therebetween. Inlet sections 15b3 that fit with the power feeders 15b2 are also formed in the mounting pads 15a. Among the mounting pads 15a having such a shape, the mounting pads 15a adjacent to each other are combined in a form reversed about an axis along the longitudinal direction of the resin substrate 10. The plural mounting pads 15a are arranged in the longitudinal direction to form the wiring pattern 15.

As shown in FIG. 6, the wiring pattern 15 has a three-layer structure. The wiring pattern 15 is formed by electrolytically plating, on the front surface of the resin substrate 10, in order from below, copper (Cu) as a first layer 151, nickel (Ni) as a second layer 152, and silver (Ag) having high reflectance as a third layer 153.

The surfaces of a part of the mounting pads 15a and the power feeders 15b2 are used as the reflecting layers 18. The resist layer 45 is formed around the reflecting layers 18. The reflecting layers 18 exposed from the resist layer 45 have high reflectance because the reflecting layers 18 are silver-plated. In the case of this embodiment, the total beam reflectance of the reflecting layers 18 is 90%. Nickel (Ni) forming the second layer 152 is formed by electrolytic plating to have film thickness equal to or larger than 5 μm. Silver (Ag) forming the reflecting layers 18 is formed by electrolytic plating to have film thickness equal to or larger than 1 μm. By setting the dimensions of the film thicknesses as explained above, the reflecting layers 18 are formed in uniform thickness and have uniform reflectance.

The light-emitting elements 11 are placed on the reflecting layers 18 in which the mounting pads 15a are exposed. Each of the light-emitting elements 11 is a solid-state light-emitting element such as an LED. The number of light-emitting elements 11 mounted on the resin substrate 10 is not specifically limited. When the light-emitting elements are LEDs, LEDs of a face-up type or a flip-chip type are used.

In order to cause a light-emitting section of the light-emitting device 1 to output white light, bare chips of the LEDs that emit blue light are used. The light-emitting elements 11 are bonded on the reflecting layers 18 by a silicone resin insulative adhesive 16 having translucency.

In this embodiment, the light-emitting elements 11 are Indium-Gallium-Nitride (InGaN) bare chips and have a structure in which a light-emitting layer is laminated on a translucent sapphire element resin substrate. The light-emitting layer is formed by sequentially laminating an n-type nitride semiconductor layer, an InGan layer, and a p-type nitride semiconductor layer.

Electrodes for feeding an electric current to the light-emitting layer include plus electrodes formed by p-type electrode pads on p-type nitride semiconductor layers and minus electrodes formed by n-type electrode pads on n-type nitride semiconductor layers. As shown in FIGS. 3 and 6, these electrodes are electrically connected on the wiring pattern 15 by bonding wires 17. More specifically, the upper surfaces of the light-emitting elements 11 and the reflecting layers 18 in which the mounting pads 15 are exposed are connected. The upper surfaces of the light-emitting elements 11 and the reflecting layers 18 in which the power feeders 15b2 are exposed are connected.

The bonding wires 17 are thin lines of gold (Au). The bonding wires 17 are connected via a bump containing gold (Au) as a main component in order to improve mounting strength and reduce damage to the light-emitting elements 11. The bonding wires 17 are not limited to gold (Au) and other metal thin lines may be used.

As representatively shown in FIG. 3, the plural light-emitting elements 11 are arranged on the mounting pad 15a to correspond to the power feeders 15b2. In the first embodiment, six light-emitting elements 11 are mounted on one mounting pad 15a to correspond to each of the power feeders 15b2 in the center and the power feeders 15b2 along the long sides, i.e., twelve light-emitting elements 11 are mounted in total. The light-emitting elements 11 are provided in the same manner in each of the plural mounting pads 15a arranged in the longitudinal direction of the resin substrate 10. The light-emitting elements 11 of the mounting pads 15a are arranged to form plural rows. In this embodiment, the light-emitting elements 11 form two rows in the longitudinal direction.

Since the power feeders 15b2 of the mounting pad 15a enter the inlet sections 15b3 of the mounting pad 15a adjacent to the mounting pad 15a, the light-emitting elements 11 are arranged in the center of the mounting pad 15a. Therefore, heat generated from the light-emitting elements 11 is effectively radiated through the mounting pad 15a.

The light-emitting elements 11 disposed in this way receive the supply of power by being sequentially connected from an anode of the power-supply to the plus electrodes of the light-emitting elements 11 via the mounting pad 15a and the bonding wires 17 (one ends are connected to the reflecting layers. 18, which are exposed surfaces of the mounting pad 15a) and connected from the minus electrodes of the light-emitting elements 11 to the power feeders 15b2 adjacent thereto via the bonding wires 17 (one ends are connected to the reflecting layers 18, which are exposed surfaces of the power feeders 15b2). In this embodiment, the bonding wires 17 are connected in a direction orthogonal to a direction in which the light-emitting elements 11 form the rows.

In the light-emitting device 1 in which the light-emitting elements 11 are connected as explained above, the twelve light-emitting elements 11 on one mounting pad 15a are connected in parallel, and the nine mounting pads 15a are connected in series. The capacitors C inserted to prevent a lighting error include first capacitors, each of which is connected between electrodes of mounting pads 15a and a second capacitor connected to a series circuit formed of all the mounting pads 15a.

As shown in FIG. 6, the light-emitting elements 11 and the bonding wires 17 are covered by the sealing resin layers 12. The sealing resin layers 12 are provided to cover the reflecting layers 18 and a part of the resist layer 45.

The sealing resin layers 12 are formed of sealing resin containing an appropriate amount of phosphors in transparent thermosetting resin. The phosphors are excited by light emitted by the light-emitting elements 11 and emits light having color different from a color of light emitted by the light-emitting elements 11. In this embodiment, since the light-emitting elements 11 emit blue light, in order to emit white light as output light of the light-emitting device 1, a yellow phosphor that radiates yellow light having a complementary color relation with the blue light is used. As the phosphors, for example, Yttrium Aluminum Garnet (YAG):Cerium (Ce) can be used.

With the light-emitting device 1 having the structure according to this embodiment, a phenomenon occurs in which an organic gas generated from the resin substrate 10 permeates through the sealing resin and reaches the reflecting layers 18 formed of silver or the like. When a general aluminum substrate or ceramic substrate is used, an organic gas is not generated from the substrate. In a package LED in which an LED chip is not directly mounted on a substrate, organic gas does not permeate through the sealing resin and reach the reflecting layers 18. However, in the light-emitting device 1 having the structure in this embodiment, the reflecting layers 18 are discolored by the organic gas generated from the resin substrate 10 and the reflectivity of the reflecting layers 18 is degraded. As a result, a luminous flux maintenance factor falls.

Therefore, in this embodiment, thermoplastic resin having oxygen permeability equal to or smaller than 1200 $cm^3/(m^2 \cdot day \cdot atm)$ is used as a sealing resin material. It is possible to suppress permeation of the organic gas and suppress degradation of the reflecting layers by using the thermoplastic resin having oxygen permeability equal to or smaller than 1200 $cm^3/(m^2 \cdot day \cdot atm)$. A reason for this is explained later with reference to a specific example.

Examples of the thermoplastic resin having oxygen permeability equal to or smaller than 1200 $cm^3/(m^2 \cdot day \cdot atm)$ include a silicon resin having a phenyl group.

Figure 4:
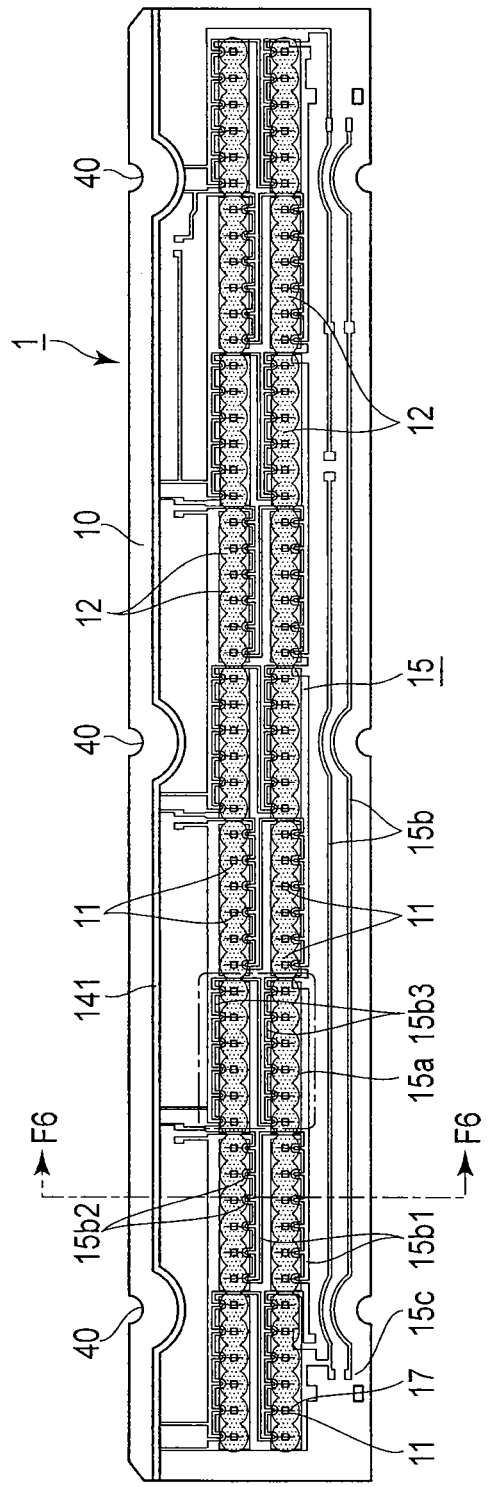
FIG. 4 is a plan view of the resin substrate shown in FIG. 3 on which sealing resin layers are provided.

In this embodiment, as shown in FIGS. 1, 4 and 6, the sealing resin layers 12 cover the respective light-emitting elements 11 one by one. As shown in FIG. 6, the respective sealing resin layers 12 are formed in a dome-shape convexity. In the bases of the sealing resin layers 12 adjacent to each other, continuous sections 12s are formed to extend to each other. As a result, as shown in FIGS. 1 and 4, the sealing resin layers 12 of the light-emitting elements 11 forming one light-emitting element row are tied in a row. In the case of this embodiment, the sealing resin layers 12 are formed in two rows in the longitudinal direction of the resin substrate 10 and cover and seal the light-emitting elements 11 and the bonding wires 17.

The sealing resin layers 12 are formed by dripping the thermoplastic resin in an unhardened state, which contains the phosphors and the viscosity and the amount of which are adjusted, onto the light-emitting elements 11 and thereafter curing the thermoplastic resin through heating treatment or by leaving the thermoplastic resin untouched for a specified time. For example, a dispenser can be used for dripping the thermoplastic resin.

The dripped thermoplastic resin is formed in a dome shape as shown in FIG. 6. The base of the dome shape expands in the outer circumferential direction according to the fluidity of the resin material. As explained above, the bases of the adjacent sealing resin layers 12 extend to each other to form the continuous sections 12s. Therefore, the adjacent sealing resin layers 12 are fused by the continuous sections 12s and integrally harden.

The respective sealing resin layers 12 are not limited to the embodiment and may be independent from one another. The bases of the adjacent sealing resin layers 12 do not have to be continuous. Alternatively, each of the sealing resin layers 12 may be formed to cover the plural light-emitting elements 11. A method of forming the sealing resin layers 12 is not limited to the forming method explained above.

FIG. 7 is a schematic diagram of the sealing resin layer 12 applied to one light-emitting element 11 viewed from above. For convenience, components covered by the sealing resin layer 12 are indicated by dotted lines. In a covering region of the sealing resin layer 12, the reflecting layer 18 is exposed from the resist layer 45. In other words, the edge of the reflecting layer 18 exposed to the front surface side is present in the covering region of the sealing resin layer 12.

The light-emitting element 11 is placed on the reflecting layer 18. The light-emitting element 11 is connected by the bonding wire 17 to each of the reflecting layers 18 and the adjacent reflecting layer 18, on which the light-emitting element 11 is placed.

In this embodiment, when the area of a region on a substrate covered by the sealing resin layer 12, i.e., the reflecting layer 18 and the resist layer 45 covered by the sealing resin layer 12 (an area of a substantially circular region surrounded by a solid line in FIG. 7) is assumed to be 100%, the area of the reflecting layer 18 is set within a range of a ratio equal to or larger than 30% and equal to or smaller than 75%.

Since the reflectance of the reflecting layer 18 is higher than the reflectance of the resist layer 45 around the reflecting layer 18, the light-emitting efficiency of the light-emitting device 1 is higher when the area of the reflecting layer 18 is larger. For example, a difference between the light reflectance of the reflecting layer 18 and the light reflectance of the resist layer 45 at the time when light having wavelength of 450 nm is irradiated on the reflecting layer 18 and the resist layer 45 is equal to or larger than 3.5%.

However, since the resist layer 45 has higher adhesion to the sealing resin than the reflecting layer 18, if the area of the resist layer 45 covered by the sealing resin layer 12 is too small, the adhesion of the sealing resin layer 12 weakens. Therefore, an area ratio of the reflecting layer 18 and the resist layer 45 in the sealing region is desirably set in the range explained above.

Specifically, the area of the reflecting layer 18 covered by the sealing resin layer 12 is set to 30% to 75% of the area of the covering region. This makes it possible to increase the reflectance and improve the light-emitting efficiency and strengthens the adhesion of the sealing resin layer 12. If the area of the reflecting layer 18 is smaller than 30%, the light-emitting efficiency is deteriorated. On the other hand, if the area of the reflecting layer 18 exceeds 75%, peeling and the like of the sealing resin layer 12 are more likely to occur and reliability is deteriorated. A reason for this is explained later with reference to a specific example.

The thermoplastic resin having oxygen permeability equal to or smaller than 1200 $cm^3/(m^2 \cdot day \cdot atm)$ is used as the sealing resin material and the area of the reflecting layer 18 covered by the sealing resin layer 12 is set in the range of 30% to 75% of the area of the entire covering region according to this embodiment. This makes it possible to suppress degradation of the reflecting layer 18 and improve the light-emitting efficiency and the luminous flux maintenance factor of the light-emitting device 1. Consequently, it is possible to extend the life of the light-emitting device 1. For example, according to this embodiment, it is possible to increase a luminous flux maintenance factor to 90% or more when the light-emitting device 1 is lit at a rated value for 1000 hours at temperature of 85° and humidity of 85%.

Further, thermosetting resin having hardness measured by a durometer (type A) in a range of hardness equal to or higher than 45 and equal to or lower than 89 is desirably used for the sealing resin layer 12 used in this embodiment. Since the hardness is equal to or higher than 45, the strength of the sealing resin layer 12 can be increased. Consequently, for example, even if an object comes into contact with the sealing resin layer 12 when the light-emitting device 1 is handled, it is possible to prevent the sealing resin layer 12 from being destroyed. On the other hand, since the hardness is equal to or lower than 89, even if the sealing resin repeatedly expands and contracts due to temperature changes caused by switching the light-emitting device 1 on and off, it is possible to prevent the bonding wires 17 on the inside of the sealing resin layer from being ruptured.

A more desirable range of the hardness of the thermosetting resin fluctuates according to the use of the light-emitting device 1. However, the hardness of the thermosetting resin is desirably set in a range of, for example, 62 to 78. In the case of the light-emitting device 1 with which an object is highly likely to come into contact with the sealing resin layer 12 during handling, it is desirable to use relatively hard thermoplastic resin. On the other hand, in the case of the light-emitting device 1 with which an object is less likely to come into contact during handling, it is possible to further reduce the likelihood of rupture of the bonding wires 17 using relatively soft thermoplastic resin.

Furthermore, the thermosetting resin used in this embodiment is desirably thermosetting resin that causes interfacial peeling of the sealing resin layer 12 from the resin substrate 10 when forcible stress is applied to the surface of the resin substrate 10 in a surface direction. By using the resin that causes the interfacial peeling of the sealing resin layer 12, it is possible to prevent internal fracture of the sealing resin layer 12 from occurring when stress is applied to the resin substrate 10.

If the internal fracture of the sealing layer 12 occurs, a long period of time from the internal fracture event may pass before the light-emitting elements 11 stop lighting. Therefore, it is not easy to find a failure. On the other hand, if the resin that causes the interfacial peeling is used, the luminance of only the light-emitting element 11 in which peeling occurs falls. Therefore, it is easy to find a failure.

Such thermoplastic resin is desirably thermoplastic resin that does not cause the interfacial peeling from the resin substrate 10 and does not cause the resin internal fracture when stress of 800 g is applied in a JIS pencil scratch test (1 kg load). By using the resin that causes neither the interfacial peeling nor the resin internal fracture when the stress of 800 g is applied, it is possible to secure the strength of the sealing resin layer 12 and improve the durability of the light-emitting device 1.

Examples of the thermosetting resin include a silicon resin having a phenyl group. In this case, examples of the resist layer 45 to which the thermosetting resin bonds include white paint containing white pigment such as titania.

Furthermore, the thermosetting resin used in this embodiment desirably has a refractive index equal to or higher than 1.50 and equal to or lower than 1.66. Since the refractive index of the sapphire element resin substrate of the light-emitting elements 11 is about 1.76, if resin having a refractive index equal to or higher than 1.50 is used, extraction efficiency of light from the sapphire element resin substrate to the sealing resin layer 12 is improved. As a result, an amount of light reaching the phosphors increases. Consequently, it is possible to improve the light-emitting efficiency of the light-emitting device 1. On the other hand, by using resin having a refractive index equal to or lower than 1.66, it is possible to suppress deterioration in extraction efficiency of light from the sealing resin layer 12 to the external air.

As shown in FIGS. 5 and 6, the resin substrate 10 includes a pattern of a copper foil 46 for thermal radiation formed over substantially the entire surface on the rear side. This pattern includes eighteen blocks divided into a matrix shape of two blocks in the width direction of the resin substrate 10 and nine blocks in the longitudinal direction of the resin substrate 10 to correspond to the mounting pads 15a on the front surface side.

Since the resin substrate 10 includes the copper foil 46 having a relatively large area in this way, heat generated by the light-emitting elements 11 is equally diffused over the entire resin substrate 10. Therefore, the thermal radiation performance of the resin substrate 10 is stabilized. As shown in FIG. 5, a discontinuous zone 46a where the copper foil 46 is not formed is present orthogonal to the longitudinal direction of the resin substrate 10. Therefore, a warp and deformation caused in the resin substrate 10 by heat are suppressed. As shown in FIG. 6, the copper foil 46 is covered by the insulating layer 47.

An outline of a manufacturing process for the light-emitting device 1 configured as explained above is explained with reference to FIGS. 2 to 4.

First, as shown in FIG. 2, the wiring pattern 15 and the connection pattern 14 are formed on the front surface side of the resin substrate 10. The wiring pattern 15 has the three-layer structure explained above. The connection pattern 14 has a three-layer structure same as the three-layer structure of the wiring pattern 15. The wiring pattern 15 functions as a power-supply path for supplying electric power to the light-emitting elements 11. The connection pattern 14 functions as a connection path for setting the mounting pads 15a to equal potential when nickel (Ni) of the second layer and silver (Ag) of the third layer are electrolytically plated on the pattern of copper (Cu) of the first layer.

In a formation process for the wiring pattern 15 and the connection pattern 14, a copper (Cu) pattern is formed as the first layer on the front surface of the resin substrate 10. Subsequently, nickel (Ni) and silver (Ag) are electrolytically plated in order respectively as the second layer and the third layer.

As shown in FIG. 3, the connection pattern 14 is scraped off by a router, a trimmer, or the like from the front surface side of the resin substrate 10 on which the wiring pattern 15 and the connection pattern 14 are formed. As a result, the electrical connection among the mounting pads 15a is cut off. Since the connection pattern 14 is scraped off, the groove 141 linearly recessed in a rectangular shape in the longitudinal direction is formed on the front surface side of the resin substrate 10 as a trace excluding a portion that bypasses the perforated sections 40.

When the wiring pattern 15 is formed, the plural light-emitting elements 11 are mounted to form a light-emitting element row. As shown in FIG. 4, the mounted light-emitting elements 11 are respectively covered and sealed by the sealing resin layers 12. The sealing resin layers 12 are continuously arranged to cover the row of the light-emitting elements 11 arranged in the longitudinal direction of the resin substrate 10.

The luminaire 20 including the light-emitting device 1 is explained with reference to FIG. 8. In the luminaire 20 shown in FIG. 8, the light-emitting device 1 is built in to face downward. The luminaire 20 is a luminaire of a ceiling mounting type set on the ceiling and used.

The luminaire 20 includes the luminaire main body 21 having an elongated substantially rectangular parallel piped shape. The luminaire main body 21 includes plural light-emitting devices 1, in this embodiment, two linearly-connected light-emitting devices 1. A power-supply unit including a power-supply circuit is incorporated in the luminaire main body 21. A front cover 22 having light diffusibility is attached to the luminaire main body 21 and covers an opening of the luminaire main body 21 opened downward.

The light-emitting device 1 having the configuration explained above is further explained. When the light-emitting device 1 is energized by the power-supply circuit, the light-emitting elements 11 are turned on all together. When lights emitted from the light-emitting elements 11 are transmitted through the sealing resin layers 12, the lights excite the phosphors in the sealing resin layers 12 to emit light. When the emitted lights of the light-emitting elements 11 and the excitation light of the sealing resin layers 12 are combined, white light is obtained. Therefore, the light-emitting device 1 functions as a surface light source that emits white light.

In this case, the sealing resin layers 12 have a dome shape and the light-emitting elements 11 are arranged in the centers of the domes. Therefore, the lights emitted from the light-emitting elements 11 are suppressed from being totally reflected on the inner side of boundary surfaces of the sealing resin layers 12. As a result, degradation in light-emitting efficiency due to a reflection loss is suppressed.

The adjacent sealing resin layers 12 extend to each other in the bases of the sealing resin layers 12. Until the sealing resin layers 12 are hardened, the sealing resin layers 12 are mutually mixed by the continuous sections 12s. Therefore, fluctuations in the volumes of the sealing resin layers 12 are averaged. Since the external shapes of the sealing resin layers 12 are averaged, fluctuations in light outputs, light emission colors, and the like of the lights emitted from the respective light-emitting elements 11 are reduced. Therefore, light irradiated by the light-emitting device 1 is homogenized. Consequently, the luminaire 20 including the light-emitting device 1 stably emits light.

In the embodiment, while the light-emitting elements 11 are emitting light, the mounting pads 15a function as heat spreaders that diffuse heat generated by the light-emitting elements 11. When the light-emitting device 1 is emitting light, most light traveling to the resin substrate 10 among the light emitted from the light-emitting elements 11 is reflected on the reflecting layers 18, which are formed on the surface layers of the mounting pads 15a. Light traveling in a direction along the resin substrate 10 among the light emitted by the light-emitting elements 11 is reflected on the surface of the white resist layer 45 having high reflectance in a direction.

According to the embodiment explained above, it is possible to provide the light-emitting device 1 having the suppressed degradation of the reflecting layers 18 covered by the sealing resin, improved light-emitting efficiency and luminous flux maintenance factor, and an extended life. Further, it is possible to provide the luminaire 20 including such a light-emitting device and having the extended life.

The light-emitting device 1 and the luminaire 20 including the light-emitting device 1 can be applied as light sources mounted on a luminaire, a display apparatus, and the like used indoor or outdoor.

EXAMPLES

Test 1

A relation between the oxygen permeability and a luminous flux maintenance factor of the thermosetting resin forming the sealing resin layer was examined.

Example 1

The light-emitting device 1 was manufactured using the FR-4 substrate 10 having width of 27 mm and length of 200 mm. Four light-emitting elements 11 were arranged in a row at an interval of 3 mm in the same sealing resin layer 12. The width of the sealing resin layers 12 having the dome shape was set to 2.9 mm. An electric current of about 30 mA at a voltage of about 3 V was used as the power source for the light-emitting elements 11. A silicon resin having a phenyl group and having oxygen permeability equal to or lower than 1200 $cm^3/(m^2 \cdot day \cdot atm)$ was used as the material for the sealing resin layer 12. A ratio of the area of the reflecting layers 18 to the area of the regions covered by the sealing resin layers 12 was set to 50%.

Example 2 and Comparative Examples 1 to 2

The light-emitting devices 1 were manufactured in the same manner as the example 1 except that thermosetting resin having oxygen permeability shown in Table 1 was used as the material of the sealing resin layers 12.

Lighting Test

Figure 9:
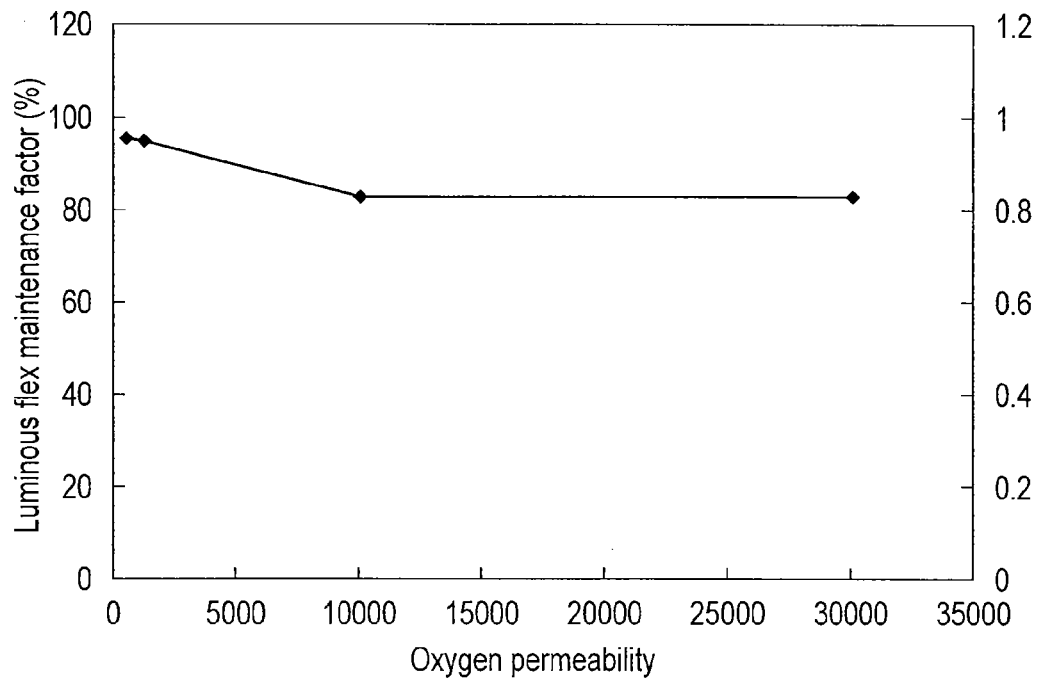
FIG. 9 is a graph of a relation between oxygen permeability and a luminous flux maintenance factor of thermosetting resin.

The light-emitting devices 1 of the examples 1 and 2 and the comparative examples 1 and 2 were lit for 100 hours at 120° and luminous flux maintenance factors were measured. A result of the measurement is shown in Table 1 and FIG. 9.

TABLE 1

|  | Oxygen permeability cm$^3$/(m$^2$ · day · atm) | Luminous flux maintenance factor (%) |
|---|---|---|
| Comparative example 1 | 30000 | 82 |
| Comparative example 2 | 10000 | 83 |
| Example 1 | 1200 | 95 |
| Example 2 | 500 | 96 |

As it is seen from Table 1, in the examples 1 and 2 in which the thermosetting resin having the oxygen permeability of 1200 cm$^3$/(m$^2$·day·atm) or lower was used, the luminous flux maintenance factor was conspicuously higher than that luminous flux maintenance factor in the comparative examples 1 and 2.

Test 2

Examples 3 and 4 and Comparative Examples 3 to 5

The light-emitting devices 1 were manufactured in the same manner as the example 1 except that a ratio of the area of the reflecting layers 18 to the area of the regions covered by the sealing resin layers 12 was set as shown in Table 2.

Light Emission Test and Cycle Test

Figure 10:
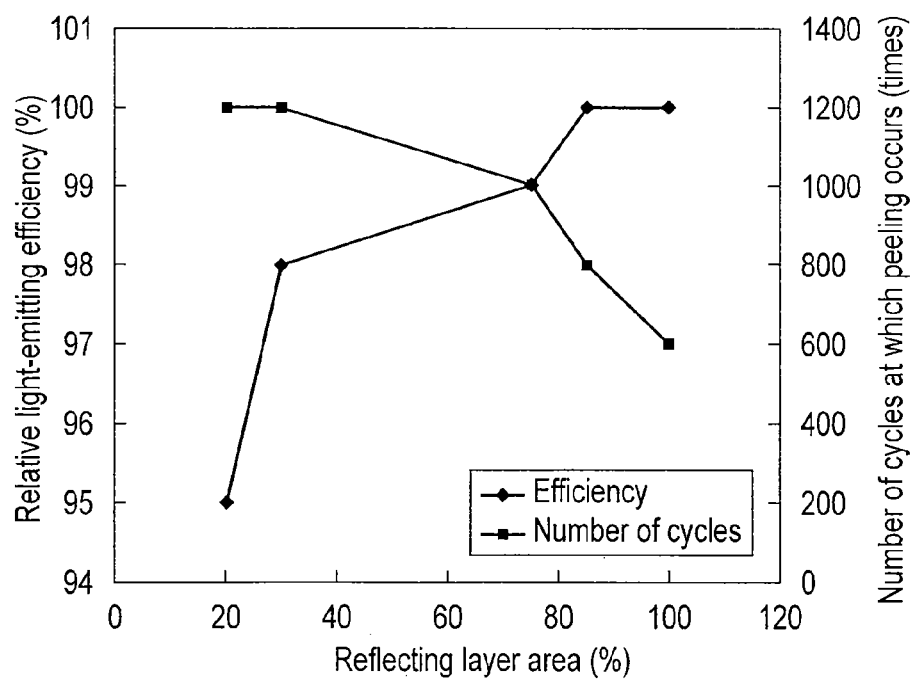
FIG. 10 is a graph of a relation among an area ratio and light-emitting efficiency of a reflecting layer and the number of cycles at which peeling occurs.

The light-emitting devices 1 of the examples 3 and 4 and the comparative examples 3 to 5 were lit immediately after product manufacturing and light-emitting efficiency was measured. A result of the measurement is shown in Table 2 as relative values to light-emitting efficiency of 100% obtained when the area of the reflecting layers 18 is 100%. A heat cycle test was performed using alternately repeating heating and cooling conditions with a temperature difference of 160° C. The number of cycles at a point when peeling of the sealing resin layers 12 occurred was observed. A result of the observation is shown in Table 2 and FIG. 10.

TABLE 2

|  | Area of reflecting layers (%) | Light-emitting efficiency relative value (%) | Number of cycles at which peeling occurred (times) |
|---|---|---|---|
| Comparative example 3 | 100 | 100 | 600 |
| Comparative example 4 | 85 | 100 | 800 |
| Example 3 | 75 | 99 | 1000 |
| Example 4 | 30 | 98 | 1200 |
| Comparative example 5 | 20 | 95 | 1200 |

As it is seen from Table 2, as the ratio of the area of the reflecting layers 18 decreased, although the light-emitting efficiency was decreased, the number of cycles at which peeling occurred increased. As indicated by the examples 3 and 4, by setting the area of the reflecting layers 18 in a range of 30% to 75%, it is possible to realize the light-emitting device 1 having high light-emitting efficiency and long life.

Test 3

Examples 5 to 8

The light-emitting devices 1 were manufactured in the same manner as the example 1 except that, as the material of the sealing resin layers 12, phenylic silicone resin, the hardness measured by the durometer (type A) of which was as shown in Table 3 and the oxygen permeability of which was 1200 cm$^3$/(m$^2$·day·atm), was used.

Rupture Test

The light-emitting devices 1, of the examples 5 to 8, were the subject of a heat cycle test using repeating heating and cooling conditions with a temperature difference of 160° C. The number of cycles at a point when rupture of the bonding wires 17 occurred was observed. External stress was applied to the sealing resin layers 12 of the light-emitting devices 1 and stress at the time when rupture of the bonding wires 17 occurred was measured. A result of the observation and the measurement is shown in Table 3 and FIG. 11.

TABLE 3

|  | Hardness | External stress at which rupture occurred (N) | Number of cycles at which rupture occurred (times) |
|---|---|---|---|
| Example 5 | 94 | 33 | 600 |
| Example 6 | 89 | 30 | 1000 |
| Example 7 | 45 | 15 | 1200 |
| Example 8 | 35 | 5 | 1300 |

As it is seen from Table 3, the result indicates that, in the examples 5 to 7 in which the hardness was equal to or higher than 45, the external force at which rupture occurred was large and durability was high. The result indicates that, in the examples 6 to 8 in which the hardness was equal to or lower than 89, the number of cycles at which rupture occurred in a heat cycle test was large and durability was high. Consequently, as indicated by the examples 6 and 7, by using the thermoplastic resin having hardness of 45 to 89, it is possible to realize the light-emitting device 1 having high durability against external stress and a heat cycle and extended life.

Test 4

Examples 9 and 10

The light-emitting devices 1 were manufactured in the same manner as the example 1 except that, as the material of the sealing resin layers 12, phenylic silicone resin, the oxygen permeability of which was 1200 cm$^3$/(m$^2$·day·atm), was used.

Light-Emitting Efficiency Test

The light-emitting devices 1 of the examples 9 and 10 were lit immediately after product manufacturing and light-emitting efficiency was measured. A result of the measurement is shown in Table 4.

TABLE 4

|  | Refractive index | Light-emitting efficiency (lm/W) |
|---|---|---|
| Example 9 | 1.41 | 100 |
| Example 10 | 1.59 | 103 |

The result indicates that, in the example 10 in which the refractive index was 1.59, the light-emitting efficiency was higher than the light-emitting efficiency in the example 9 in which the refractive index was 1.41. Therefore, the result indicates that, by using the thermoplastic resin having a high refractive index as the sealing resin material, it is possible to improve the light-emitting efficiency.

The light-emitting device 1 and the luminaire 20 including the light-emitting device 1 according to another embodiment are explained. This embodiment is the same as the first embodiment except that the sealing resin layers 12 that seal the light-emitting elements 11 of the light-emitting device 1 are different as explained below. Therefore, in the following explanation, FIGS. 1 to 8 are referred to when necessary.

In this embodiment, as in the first embodiment, the sealing resin layers 12 include phosphors and transparent thermosetting resin. However, as this thermosetting resin, resin having oxygen permeability and water vapor permeability is used.

The oxygen permeability of the resin is equal to or lower than $1200 \text{ cm}^3/(\text{m}^2 \cdot \text{day} \cdot \text{atm})$. The water vapor permeability of the resin is equal to or lower than $35 \text{ g/m}^2$-day. As the thermosetting resin having the oxygen permeability and the water vapor permeability, for example, resin-based silicone resin can be used.

As explained above, the sealing resin layers 12 that have the oxygen permeability and seal the light-emitting elements 11 have low permeability of oxygen and an organic gas. Therefore, these gases are suppressed from reaching the reflecting layers 18 made of silver on which the light-emitting elements 11 are mounted. Moreover, in addition to the low gas permeability, the sealing resin layers 12 have the water vapor permeability equal to or lower than $\text{g/m}^2$-day. Therefore, permeability of water vapor in the atmosphere is also low. Consequently, water vapor included in the outdoor air is also suppressed from permeating through the sealing resin layers 12 and reaching the reflecting layers 18.

Therefore, the reflecting layers 18 are suppressed from being discolored by gas and water vapor that permeate through the sealing resin layers 12. The degradation in the reflectivity of the reflecting layers 18 is suppressed. As a result, it is possible to the improve luminous flux maintenance factor.

At the same time, rupture of the bonding wires 17 caused by gas and water vapor that permeate through the sealing resin layers 12 less easily occurs. Specifically, since the sealing resin layers 12 that less easily allow an organic gas and water vapor to permeate therethrough is adopted, it is possible to increase the hardness of the sealing resin layers 12 and reduce stress acting on the bonding wires 17. As a result, it is possible to extend the life of the light-emitting device 1.

The water vapor permeability of the thermosetting resin included in the sealing resin layers 12 is suitably equal to or lower than $25 \text{ g/m}^2$-day. If such a range of permeability is set, deterioration of the reflecting layers 18 rarely occurs and the luminous flux maintenance factor can be further improved. If the water vapor permeability of the thermosetting resin is set closer to "0", the hardness of the sealing resin layers 12 tends to increase. Therefore, a lower limit of the water vapor permeability of the thermosetting resin does not have to be set to "0".

According to the light-emitting device and the luminaire of at least one of the embodiments described above, by setting the oxygen permeability of the sealing resin layer to be equal to or lower than $1200 \text{ cm}^3/(\text{m}^2 \cdot \text{day} \cdot \text{atm})$ and setting the area of the reflecting layer included in the sealing region by the sealing resin layer in the range of an area equal to or higher than 30% and equal to or lower than 75%, it is possible to extend the life and improve the performance of the light-emitting device and the luminaire including the light-emitting device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A light-emitting device comprising:
a resin substrate;
a reflecting layer formed on the resin substrate;
a protection layer formed around the reflecting layer;
a light-emitting element placed on the reflecting layer; and
a sealing resin layer configured to cover the reflecting layer, the protection layer, and the light-emitting element, wherein
oxygen permeability of the sealing resin layer is equal to or lower than $1200 \text{ cm}^3/(\text{m}^2 \cdot \text{day} \cdot \text{atm})$, and
a ratio of an area of the reflecting layer covered by the sealing resin layer to an entire area on the resin substrate covered by the sealing resin layer is between 30% and 75% inclusive.

2. The device according to claim 1, wherein hardness of the sealing resin layer measured by a durometer (type A) is in a range of hardness equal to or higher than 45 and equal to or lower than 89.

3. The device according to claim 1, wherein the sealing resin layer is of the type that undergoes interfacial peeling from the resin substrate prior to experiencing internal fractures, when stress is applied to a surface of the resin substrate in a surface direction.

4. The device according to claim 1, wherein the sealing resin layer has a refractive index equal to or higher than 1.50 and equal to or lower than 1.66.

5. The device according to claim 1, wherein the sealing resin layer further has water vapor permeability equal to or lower than $35 \text{ g/m}^2$-day.

6. The device according to claim 5, wherein the sealing resin layer includes resin-based silicone resin.

7. A luminaire comprising:
a luminaire main body; and
a light-emitting device attached to the luminaire main body, wherein
the light-emitting device includes:
a resin substrate attached to the luminaire main body;
a reflecting layer formed on the resin substrate;
a protection layer formed around the reflecting layer;
a light-emitting element placed on the reflecting layer; and
a sealing resin layer configured to cover the reflecting layer, the protection layer, and the light-emitting element, wherein
oxygen permeability of the sealing resin layer is equal to or lower than $1200 \text{ cm}^3/(\text{m}^2 \cdot \text{day} \cdot \text{atm})$, and
a ratio of an area of the reflecting layer covered by the sealing resin layer to an entire area on the resin substrate covered by the sealing resin layer is between 30% and 75% inclusive.

8. The luminaire according to claim 7, wherein hardness of the sealing resin layer measured by a durometer (type A) is in a range of hardness equal to or higher than 45 and equal to or lower than 89.

9. The luminaire according to claim 7, wherein the sealing resin layer is of the type that undergoes interfacial peeling from the resin substrate prior to experiencing internal fractures, when stress is applied to a surface of the resin substrate in a surface direction.

10. The luminaire according to claim 7, wherein the sealing resin layer has a refractive index equal to or higher than 1.50 and equal to or lower than 1.66.

11. The luminaire according to claim 7, wherein the sealing resin layer further has water vapor permeability equal to or lower than 35 $g/m^2$-day.

12. The luminaire according to claim 11, wherein the sealing resin layer includes resin-based silicone resin.

\* \* \* \* \*